United States Patent
Christoforo et al.

(10) Patent No.: US 8,932,898 B2
(45) Date of Patent: Jan. 13, 2015

(54) DEPOSITION AND POST-PROCESSING TECHNIQUES FOR TRANSPARENT CONDUCTIVE FILMS

(75) Inventors: Mark Greyson Christoforo, Stanford, CA (US); Saahil Mehra, Saratoga, CA (US); Alberto Salleo, San Francisco, CA (US); Peter Peumans, Leuven (BE)

(73) Assignee: The Board of Trustees of the Leland Stanford Junior Univerity, Palo Alto, CA (US)

( * ) Notice: Subject to any disclaimer, the term of this patent is extended or adjusted under 35 U.S.C. 154(b) by 0 days.

(21) Appl. No.: 13/350,511

(22) Filed: Jan. 13, 2012

(65) Prior Publication Data
US 2012/0292725 A1    Nov. 22, 2012

Related U.S. Application Data

(60) Provisional application No. 61/433,105, filed on Jan. 14, 2011.

(51) Int. Cl.
*H01L 31/18* (2006.01)
*H01L 31/0224* (2006.01)
*B22F 1/00* (2006.01)
(Continued)

(52) U.S. Cl.
CPC .... *H01L 31/022466* (2013.01); *H01L 31/1884* (2013.01); *B22F 1/0059* (2013.01); *B22F 3/24* (2013.01); *B22F 7/004* (2013.01); *C23C 4/121* (2013.01); *C23C 24/00* (2013.01); *B82Y 30/00* (2013.01); *Y02E 10/50* (2013.01); *B22F 1/0025* (2013.01); *B22F 3/002* (2013.01); *C22C 32/0021* (2013.01); *B22F 2003/248* (2013.01); *B22F 2999/00* (2013.01)
USPC ................ 438/98; 438/151; 347/14; 136/263

(58) Field of Classification Search
USPC ........ 257/431; 438/98, 151; 136/263; 347/14
See application file for complete search history.

(56) References Cited

U.S. PATENT DOCUMENTS 6,852,920 B2    2/2005   Sager et al.
6,946,597 B2    9/2005   Sager et al.
(Continued)

FOREIGN PATENT DOCUMENTS

WO    WO2007061945       *  5/2007   ............. H01M 4/92
WO    WO 2007061945 A2   *  5/2007
WO    WO2007061945 A2    *  5/2007   ............. H01M 4/86

OTHER PUBLICATIONS

Roy G. Gordon, "Criteria for Choosing Transparent Conductors," MRS Bulletin, 25, pp. 52-57(2000).
(Continued)

*Primary Examiner* — Zandra Smith
*Assistant Examiner* — Damian A Hillman
(74) *Attorney, Agent, or Firm* — Crawford Maunu PLLC

(57) ABSTRACT

In one embodiment, a method is provided for fabrication of a semitransparent conductive mesh. A first solution having conductive nanowires suspended therein and a second solution having nanoparticles suspended therein are sprayed toward a substrate, the spraying forming a mist. The mist is processed, while on the substrate, to provide a semitransparent conductive material in the form of a mesh having the conductive nanowires and nanoparticles. The nanoparticles are configured and arranged to direct light passing through the mesh. Connections between the nanowires provide conductivity through the mesh.

25 Claims, 12 Drawing Sheets

Spray deposition schematic

(51) Int. Cl.
  B22F 3/24 (2006.01)
  B22F 7/00 (2006.01)
  C23C 4/12 (2006.01)
  C23C 24/00 (2006.01)
  B82Y 30/00 (2011.01)
  B22F 3/00 (2006.01)
  C22C 32/00 (2006.01)

(56) References Cited

U.S. PATENT DOCUMENTS

| | | | |
|---|---|---|---|
| 7,309,830 B2 | 12/2007 | Zhang et al. | |
| 7,462,774 B2 | 12/2008 | Roscheisen et al. | |
| 7,511,217 B1 | 3/2009 | Roscheisen et al. | |
| 7,553,371 B2 | 6/2009 | Dubrow et al. | |
| 7,605,327 B2 | 10/2009 | Roscheisen et al. | |
| 7,645,397 B2 | 1/2010 | Parce et al. | |
| 7,680,553 B2 | 3/2010 | Popp | |
| 7,713,849 B2 | 5/2010 | Habib et al. | |
| 7,723,169 B2 * | 5/2010 | Graefe et al. | 438/166 |
| 7,803,405 B2 | 9/2010 | Keating et al. | |
| 7,803,574 B2 | 9/2010 | Desai et al. | |
| 7,804,149 B2 | 9/2010 | Tiwari et al. | |
| 7,982,296 B2 * | 7/2011 | Nuzzo et al. | 257/679 |
| 8,130,438 B2 * | 3/2012 | Agrawal et al. | 359/275 |
| 8,274,084 B2 * | 9/2012 | Daniel et al. | 257/66 |
| 8,574,710 B2 * | 11/2013 | Coffey et al. | 428/304.4 |
| 2004/0052857 A1 | 3/2004 | Keating et al. | |
| 2005/0221072 A1 | 10/2005 | Dubrow et al. | |
| 2006/0038990 A1 | 2/2006 | Habib et al. | |
| 2006/0118158 A1 | 6/2006 | Zhang et al. | |
| 2006/0204738 A1 | 9/2006 | Dubrow | |
| 2006/0267507 A1 | 11/2006 | Cho | |
| 2007/0034833 A1 | 2/2007 | Parce et al. | |
| 2007/0074316 A1 | 3/2007 | Alden et al. | |
| 2007/0190880 A1 | 8/2007 | Dubrow et al. | |
| 2007/0282247 A1 | 12/2007 | Desai et al. | |
| 2008/0108171 A1 | 5/2008 | Rogers et al. | |
| 2008/0143906 A1 | 6/2008 | Allemand et al. | |
| 2008/0173344 A1 | 7/2008 | Zhang et al. | |
| 2008/0221722 A1 | 9/2008 | Popp | |
| 2008/0276987 A1 | 11/2008 | Flood | |
| 2008/0283799 A1 | 11/2008 | Alden et al. | |
| 2008/0286447 A1 | 11/2008 | Alden et al. | |
| 2008/0288067 A1 | 11/2008 | Flood | |
| 2009/0004231 A1 | 1/2009 | Popp | |
| 2009/0143227 A1 | 6/2009 | Dubrow et al. | |
| 2009/0205563 A1 * | 8/2009 | Arena et al. | 117/102 |
| 2009/0235988 A1 * | 9/2009 | Jenekhe et al. | 136/263 |
| 2009/0295285 A1 | 12/2009 | Tokunaga et al. | |
| 2010/0139772 A1 | 6/2010 | Frank et al. | |
| 2010/0140551 A1 | 6/2010 | Parce et al. | |
| 2010/0173070 A1 | 7/2010 | Niu | |
| 2010/0178417 A1 | 7/2010 | Connor et al. | |
| 2010/0197068 A1 | 8/2010 | Poon et al. | |
| 2010/0206362 A1 | 8/2010 | Flood | |
| 2010/0217425 A1 | 8/2010 | Popp | |
| 2010/0243020 A1 | 9/2010 | Norton et al. | |
| 2010/0243295 A1 | 9/2010 | Allemand et al. | |
| 2010/0272993 A1 | 10/2010 | Volinsky et al. | |
| 2010/0276638 A1 | 11/2010 | Liu et al. | |
| 2010/0277789 A1 | 11/2010 | Wu et al. | |
| 2010/0283042 A1 | 11/2010 | Katz et al. | |
| 2010/0300514 A1 | 12/2010 | Denda et al. | |
| 2010/0300529 A1 | 12/2010 | Kawahara et al. | |
| 2010/0317132 A1 | 12/2010 | Rogers et al. | |
| 2011/0039690 A1 | 2/2011 | Niu | |
| 2011/0187798 A1 * | 8/2011 | Rogers et al. | 347/55 |
| 2011/0247197 A1 * | 10/2011 | Finn | 29/600 |

OTHER PUBLICATIONS

M. Kaempgen, G. S. Duesberg and S. Roth, "*Transparent Carbon Nanotube Coatings*," Appl. Surf. Sci. 252 (2), pp. 425-429 (2005).

T. Andelman, Y. Gong, M. Polking, M. Yin, I. Kuskovsky, G. Neumark, and S. O'Brien, "*Morphological Control and Photoluminescence of Zinc Oxide Nanocrystals*," Journal of Physical Chemistry B 109(30), pp. 14314-14318 (2005).

M. Rowell, M. Topinka, M. McGehee, H. Prall, G. Dennler, N. Sariciftci, L. Hu and G. Gruner, "*Organic Solar Cells with Carbon Nanotube Network Electrodes*," Appl. Phys. Lett. 88 (23), pp. 233506-233506-3 (2006).

W. Beyer, J. Hüpkes and H. Stiebig, "*Transparent Conducting Oxide Films for Thin Film Silicone Photovoltaics*," 516 (2-4), pp. 147-154 (2007).

J-Y. Lee, S. Connor, Y. Cui and P. Peumans, "*Solution-Processed Metal Nanowire Mesh Transparent Electrodes*," Nano Lett. vol. 8, No. 2, pp. 689-692 (2008).

L. Goris, R. Noriega, M. Donovan, J. Jokisaari, G. Kusinski and A. Salleo, "*Intrinsic and doped zinc oxide nanowires for transparent electrode fabrication via low temperature solution synthesis*," Journal of Electronic Materials, vol. 38, No. 4, pp. 586 (2009).

J-Y. Lee, S. Connor, Y. Cui and P. Peumans, "*Semitransparent Organic Photovoltaic Cells with Laminated Top Electrode*," Nano Lett. 10, pp. 1276-1279 (2010).

R. Noriega et al., "*Probing the Electrical Properties of Highly-Doped AL:ZnO Nanowire Ensembles*," Journal of Applied Physics 107, pp. 074312-1-074312-7 (2010).

"White OLED Outlook Brightens with Efficiency Breakthrough," GE Global Research Blog Jul. 15, 2010.

F. Morgenstern, D. Kabra, S. Massip, T. Brenner, P. Lyons, J. Coleman and R. Friend, "*Ag-nanowire Films Coated with ZnO Nanopoarticles as a Transparent Electrode for Solar Cells*," Applied Physics Letters 99, pp. 183307-1-183307-3 (2011).

C. Battaglia, J. Escarré, K. Söderström, M. Charriére, M. Despeisse, F.-J. Haug and C. Ballif, "*Nanomoulding of Transparent Zinc Oxide Electrodes for Efficient Light Trapping in Solar Cells*," Nature Photonics 5 (9), pp. 535-538 (2011).

D. Hecht, L. Hu and G. Irvin, "*Emerging Transparent Electrodes Based on Thin Films of Carbon Nanotubes, Graphene, and Metallic Nanostructures*," Adv. Mater. 23 (13), pp. 1482-1513 (2011).

M. Rowell and M. McGehee, "*Transparent Electrode Requirements for Thin Film Solar Cell Modules*," Energy & Environmental Science 4 (1), pp. 131-134 (2011).

* cited by examiner

Densely sprayed Ag NW mesh (scale bar = 2μm)

Sprayed ZnO NPs (scale bar = 500 nm)

Wire-Wire junctions

Disconnected wire mesh

DEPOSITION AND POST-PROCESSING TECHNIQUES FOR TRANSPARENT CONDUCTIVE FILMS

RELATED DOCUMENTS

This patent document claims benefit under 35 U.S.C. §119 to U.S. Provisional Patent Application Ser. No. 61/433,105, entitled "Deposition and Post-Processing Techniques for Thin Nanostructured Films" and filed on Jan. 14, 2011; this patent document and the Appendices filed in the underlying provisional application, including the references cited therein, are fully incorporated herein by reference.

FEDERALLY-SPONSORED RESEARCH AND DEVELOPMENT

This invention was made with Government support under contract DE-FG36-08GO18005 awarded by the Department of Energy. The Government has certain rights in this invention.

FIELD

One or more embodiments generally relate to transparent conductive films and the manufacture thereof.

BACKGROUND

Transparent conducting films play an important role in many devices combining light with electrical function in a number of applications. Depending on the application (e.g., displays, touch screens, solar cells), the transparent conducting films are used to form electrodes having unique combinations of electronic, optical, and surface properties.

Transparent conductors can be important material components in commercially viable optoelectronic devices, as they combine the properties of high transmission in the visible spectral range and low sheet resistivity. Materials used for these applications should not significantly suffer from disadvantages, such as poor natural abundance, high-cost processing steps (some require high temperatures and vacuum chambers) and/or inability to bend with flexible substrates—thus making these materials difficult to implement with low-cost and high-throughput electronic applications.

In the context of photovoltaic (PV) cells, transparent conductive films are often used as both the top transparent electrode as well as the back electrode of the device stack. Texturing techniques are often employed to induce light scattering and thus increase photon path lengths and the probability of absorbing sub-band gap energy photons as well as to offset absorption losses due to the use of less photovoltaic active layer material in the cell.

Established deposition technologies involve high temperature, vacuum sputtering processes, and harsh chemicals, which can result in less-than-ideal film texturing. For example, transparent conductive films have been produced using vacuum deposition of indium tin oxide (ITO), fluorine doped tin oxide (FTO), or aluminum doped zinc oxide (Al: ZnO). These methods produce brittle films using scarce materials and/or capital-intensive techniques.

Recent developments in low-temperature, solution-processable transparent electrode replacements (using metal/semiconductor nanostructures and carbon based nanomaterials) have achieved comparable performances to ITO. However, effectively scattering light using these approaches has been challenging, which can present difficulties when trying to fabricate a scattering transparent conductive electrode for poorly absorbing thin film PVs. Further, films can be too rough to be used with organic materials (e.g., organic light emitting diodes (OLED), organic photovoltaic cells, etc.). For example, OLEDs devices are very sensitive to the roughness of the transparent conductive layer (high roughness leads to shorting between device layers).

One or more embodiments may address one or more of the above issues.

SUMMARY

This disclosure describes a variety of fabrication methods to produce semi-transparent, conductive, and highly scattering thin nanostructured films, suitable for use in a wide variety of devices. This disclosure also describes a variety of apparatuses (and as implementable in systems) employing such films.

In one embodiment, a method is provided for fabrication of a semi-transparent conductive mesh. A first solution having conductive nanowires suspended therein and a second solution having nanoparticles suspended therein are sprayed toward a substrate, the spraying forming a mist. The mist is processed, while on the substrate, to provide a semitransparent conductive material in the form of a mesh having the conductive nanowires and nanoparticles. The nanoparticles direct light passing through the mesh, and connections between the nanowires provide conductivity through the mesh.

In another embodiment, a method is provided for fabrication of a semitransparent conductive mesh. A solution having conductive nanowires suspended therein is sprayed toward a substrate, the spraying forming a mist. The mist is processed, while on the substrate, to provide a semitransparent conductive material in the form of a mesh of the conductive nanowires. The nanowires of the mesh are joined at points where the nanowires cross to provide a conductivity characteristic throughout the semitransparent conductive material, and the mesh is flattened.

In yet another embodiment, an apparatus is provided. The apparatus includes a substrate and a layer of one or more photovoltaic cells formed on the substrate. A semitransparent conductive film is formed on the layer of one or more photovoltaic cells, the semitransparent conductive film having a mesh of conductive nanowires and nanoparticles pseudo-randomly oriented on the surface of the layer, the nanoparticles configured to direct light passing through the semitransparent conductive film. Connections between the nanowires provide conductivity through the semitransparent conductive film.

Other aspects of the present disclosure may be more completely understood in consideration of the following more-detailed description of various experimental embodiments and specific applications herein, which may be implemented in connection with one or more of the above-described aspects, embodiments, and implementations.

BRIEF DESCRIPTION OF THE DRAWINGS

The disclosure may be more completely understood in consideration of the detailed description of various embodiments of the disclosure that follows in connection with the accompanying drawings as follows.

Figure 1:
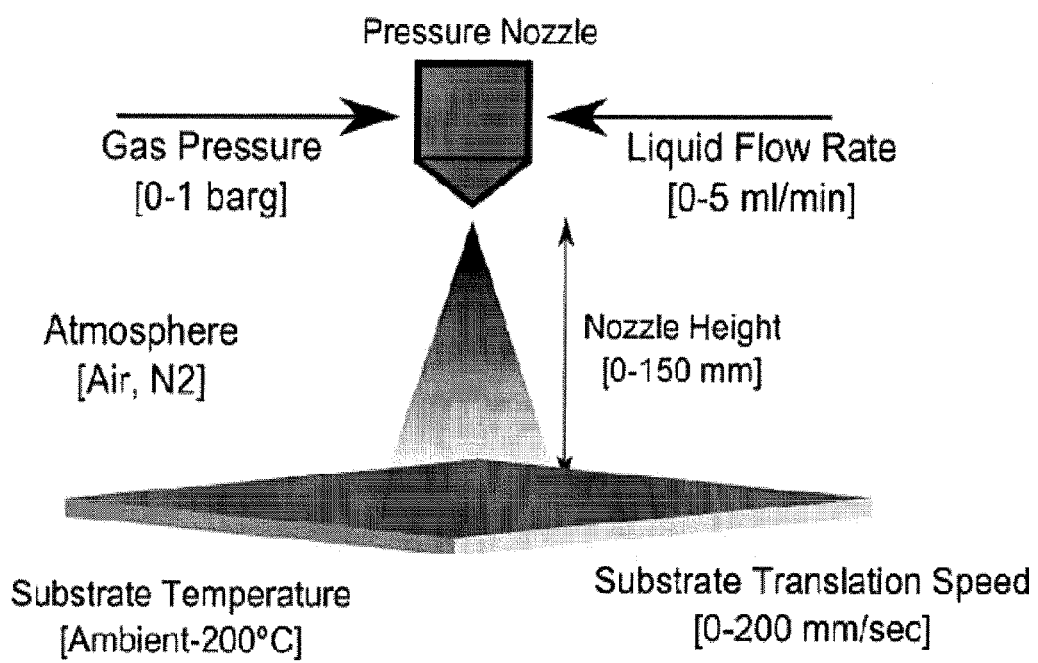
FIG. 1 shows a spray deposition schematic, consistent with one or more embodiments.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

This disclosure describes a variety of fabrication methods to produce transparent, conductive and highly scattering thin nanostructured films, suitable for use in a wide variety of devices (in some instances, without further modification). This disclosure also describes a variety of apparatuses, which may implement such films.

In one or more embodiments, a transparent conductive film is formed from a mesh of nanowires. In a particular implementation, silver (Ag) nanowires are implemented in a mesh to provide conductive characteristics while also exhibiting strong transmissive properties for light. It is understood that such a mesh is semi-transparent in that light passes through, and in that some light may be reflected and/or absorbed by the mesh. For ease of reference, transparent and semitransparent films may generically be referred to as being transparent.

In some embodiments, light scattering properties are enhanced using nanoparticles distributed throughout the nanowire mesh. For instance, zinc oxide (ZnO) nanoparticles may be distributed throughout a mesh to provide light scattering and therein produce a hybrid transparent conductive film of nanowires and nanoparticles. Conductivity in the hybrid film is provided by overlapping ones of the nanowires in the mesh and light scattering is provided by the nanoparticles distributed in the mesh. For various embodiments, conductivity and light scattering may be independently controlled in film formation by, e.g., adjusting the concentrations of the deposited nanowires and nanoparticles. While several materials may be used to form the nanowires and nanoparticles of the hybrid film, for ease of explanation the examples and embodiments are primarily described with reference to hybrid films including Ag nanowires and ZnO nanoparticles.

One or more embodiments provide solution-based methods for fabricating hybrid transparent conductive films (e.g., as opposed to vacuum based deposition processes), where films are deposited using low-temperature spray deposition techniques that could serve as turnkey replacements for established technologies for transparent conductive electrode fabrication. A solution-processed pneumatic spray deposition can be used to form films having ZnO/Ag nanostructures (e.g., nanowires, nanoparticles, etc.) configured and arranged as described above to provide superior sheet resistances ($R_{sheet}$<5 Ω/sq) and higher transmissions (T>90%) and significantly higher haze (scattering) at infrared/near-infrared wavelengths ($Haze_{1100nm}$>30%) than industry standard Zinc Oxide (ZnO) or Indium Tin Oxide (ITO) can be repeatedly deposited.

While the solution based pneumatic spray deposition methods are primarily described with reference to deposition of hybrid nanostructured films having Ag nanowires and ZnO nanoparticles, it is recognized that the solution based pneumatic spray deposition methods may be applied to deposition of either Ag nanowires or ZnO nanoparticles independent of the other as well.

For ease of reference, the term nanostructure may be generically used herein to refer to any nanostructured material whose composition is modulated over nanometer length scales in one, two, or three dimensions, including, e.g., nanowires and nanoparticles. The term nanowire may be used to refer to an elongated nanostructures and nanoparticle may be used to refer to a non-elongated nanostructure as would be understood by one skilled in the art.

In one embodiment, nanowires and nanoparticles are transferred from suspension in an alcohol solution onto a substrate. The solution is vortex-mixed to ensure that the colloidal solution is homogenous. The solution is then drawn into a syringe and loaded into a syringe pump. The syringe pump delivers the solution to a spray nozzle that converts the solution into a mist. Various types of nozzles may be utilized in different implementations. For instance, in one implementation, a pneumatic spray nozzle mixes a pressurized gas (e.g., $N_2$) and a liquid solution at the tip where the gas pressure converts the solution into a mist and projects it towards the substrate. In some other embodiments, the nozzle may utilize sonic vibrations to convert the solution into a mist. It is recognized that other types of nozzles may be used as well.

FIG. 1 shows a spray deposition schematic that may be used in accordance with one or more embodiments. In this embodiment, a computer program is used to control spray system variables including, e.g., solution delivery rate (to within 1 μl/hr), the $N_2$ gas pressure (to within 1 psi), the substrate holder temperature (to within 2° C.) and the movement speed and pattern of the substrate. The distance between the nozzle and the substrate is manually adjustable. The spray system variables are controlled such that the deposition leaves a uniform density distribution of pseudo-randomly oriented nanostructures on the substrate. This is achieved when the solvent droplets of the mist are sized so that each one contains roughly one nanostructure.

In some embodiments, a spray parameter is controlled to set a droplet size upon impact with the substrate. This is influenced by solvent evaporation rate (controlled here by substrate temperature), nozzle height, $N_2$ pressure, solution flow rate and type of solvent used. For example, if the solvent droplets are too large when they reach the substrate, they will coalesce on the substrate surface and lead to a non-uniform film with aggregations of nanowires and/or nanoparticles. On the other hand, if the solvent droplets are too small out of the nozzle, the solvent will evaporate before reaching the substrate and the nanostructures will not stick, resulting in wasted nanostructures and poor transfer efficiency (transfer efficiency=[nanostructure mass on substrate]/[nanostructure mass in solution]). In this scenario, striking this size balance can help enable the results as shown below.

In this embodiment, the deposition process uses Ag nanowires, ZnO nanoparticles and a mixture of the two morphologies, with Isopropyl Alcohol (IPA) and Ethanol (EtOH) as solvents. The spray deposition forms a mesh of Ag nanowires randomly oriented on the substrate surface. The holes in the mesh allow light to pass through while the connections between the wires allow for electrical conductivity along the mesh. Silver exhibits high reflectivity and low absorption for visible light, which enhances (e.g., maximizes) light transmission through the film. Zinc oxide deposition produces a mat of nanoparticles on the substrate surface. Zinc oxide is also a poor absorber of visible light and has a relatively high refractive index; these material properties are coupled with the proper nanoparticle geometry to achieve ZnO films that exhibit very high haze and high total transmissivity.

This deposition process can be used to co-deposit Ag nanowires and ZnO nanoparticles simultaneously. The simultaneous deposition may be performed from a mixed solution containing both Ag nanowires and ZnO nanoparticles or using separate solutions respectively containing either Ag nanowires or ZnO nanoparticles. Alternatively, the deposition process may deposit Ag nanowires and ZnO nanoparticles sequentially (one after another).

In one embodiment, a laboratory scale spray deposition system may be used to form the hybrid films described above. To use this system, a pressure driven delivery system can replace the syringe pump driven delivery. Here, the nanostructure solution is contained in an enclosed pressure vessel. Gas is forced into the vessel at a controlled pressure, which forces the liquid out of a delivery tube to the nozzle. The liquid flow rate is then primarily a function of gas pressure, nozzle orifice size, and liquid viscosity.

In certain embodiments, an X-Y stage is used to raster the substrate under the nozzle many times in order to cover the desired substrate area with a desired density of nano structures. Other embodiments may use a system analogous to a "roll-to-roll" process, where a continuous substrate web passes linearly through a deposition machine and the deposition is complete by the time the substrate has been pulled through the machine. In this scenario, one or more rows of nozzles may be spaced appropriately so that coverage remains uniform. In some other embodiments, deposition onto PET (polyethylene terephthalate) may be used. For certain large area applications (such as PV and OLEDs), concentrating on flexible, roll-to-roll PET substrates can play an important role.

In one or more embodiments, the nanostructured film deposition takes place in a chamber that is kept at a slight negative pressure relative to ambient conditions, in order to inhibit or prevent nanoparticles from entering the air in the surrounding room. This chamber can be purged with nitrogen gas during deposition to ensure laminar flow within the deposition chamber.

One or more embodiments may employ one or more post-processing techniques to improve conductivity, reduce roughness and pattern films to prepare them for use in devices. For example, as mentioned above, film roughness may damage organic materials such as those used in OLED applications. In one embodiment, a technique of spraying Ag nanowires onto a thin (100-200 nm) film of PMMA (Poly (methyl methacrylate)) on glass and then pressing the mesh into the PMMA film is used to achieve surfaces that are smooth enough to use for OLEDs and solar cells. Heating (to 100-200° C.) is applied during this pressing step to improve wire/wire junctions. In one implementation, the pressing step is done at ~413 MPa with a stamp type press. For higher throughput, roll-to-roll type production schemes, a roller-type press may be used.

Figure 2:
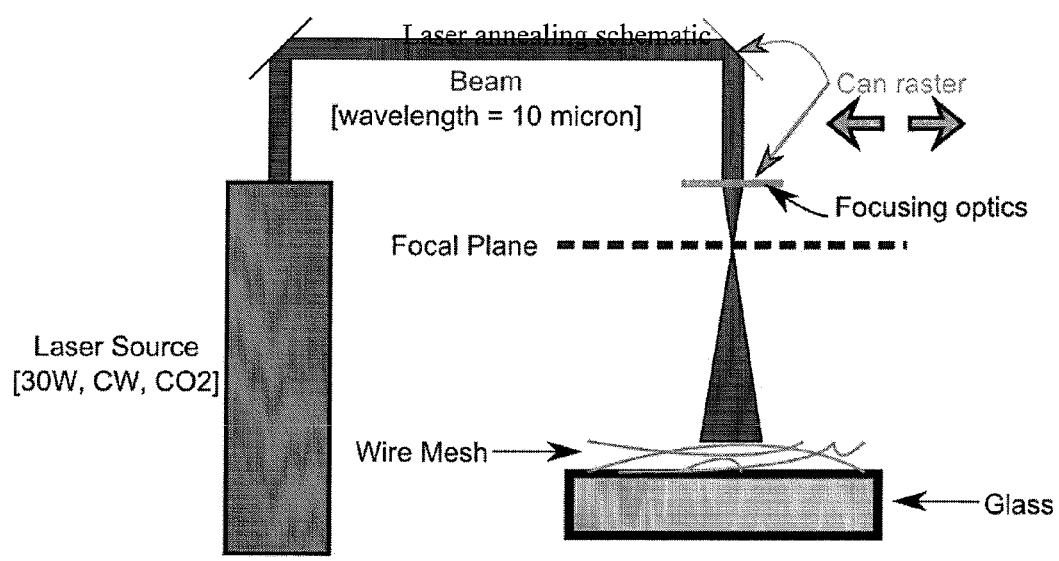
FIG. 2 shows a laser annealing schematic, consistent with one or more embodiments.

In one or more embodiments, a laser annealing step may be employed to join Ag nanowire meshes, for example. This step rasters a defocused 30 W $CO_2$ laser over the mesh in order to sinter together wires at their crossing points. In order to produce uniform annealing of the wire mesh, a cylindrical lens can be used so that the laser spot shape becomes a line instead of a circle. During annealing, a strong jet of $N_2$ impinges on the laser spot. In this embodiment, process parameters including raster speed, raster spacing, laser power, and spot size can be set and controlled in accordance with the discussion herein. FIG. 2 shows such a laser annealing schematic, consistent with other embodiments of the present disclosure. The joining of the nanowires as points where the nanowires cross provides conductivity throughout the nanowire mesh.

In certain applications, it is valuable to define specific regions of conductivity in the transparent film while leaving other regions non-conductive (e.g., in preparation for making a device on a transparent conductor). Presented herein are several different high resolution methods for patterning Ag nanowire meshes that remove conductivity from desired areas after nanowires have been joined at crossing points.

In one implementation, a certain region of an Ag nanowire mesh is rendered non-conductive by overheating to break the connectivity of the mesh. This causes the wires to aggregate into disconnected silver spheres. In this embodiment, a laser is used to heat the mesh in order to gain very fine control of those areas that are overheated and those that are not. In certain cases, properly disconnecting mesh requires raising the laser power per unit area per unit time to 2-3 times above what is used in a laser annealing step. This can be done by increasing laser output power, reducing spot size, slowing raster rate or some combination thereof. Because this method can leave small silver spheres in the disconnected areas, making these films quite rough, this method can be readily implemented in applications in which low surface roughness may not be important (such as for capacitive touch screens).

Another embodiment is directed to a method for patterning an Ag nanowire mesh that leaves a clean substrate in some areas and a properly connected mesh in others. Here, the entire substrate is coated with a 100-200 nm PMMA film. Spray deposition, annealing, and patterning are all done as described in the previous method, except that, instead of silver spheres, we get complete ablation in the patterned regions, leaving clean substrate exposed. This is a result of the laser overheating the PMMA. The overheating effectively causes the wire mesh on top of it to explode off the substrate surface and be carried away by the $N_2$ gas flowing over the substrate during patterning.

FIGS. 3-13 illustrate example detailed/experimental-type embodiments using one or more of the various embodiments described above.

In connection with various embodiments, Ag and ZnO nanostructures were combined to make hybrid electrodes, and exhibit surprising results such as those relating to the combination of electrical conductivity facilitated via the Ag nanowires structures and haze (scattering) via the incorporation of ZnO nanoparticles. It has been discovered that, upon spraying these hybrid electrodes, in both the sequential sprayed implementation (Ag then ZnO), or the simultaneous co-sprayed case, (Ag/ZnO mixture together), for the densities of particles used, sufficiently high haze factors were maintained while still maintaining low sheet resistance throughout the film. This indicates that that the conductive properties were upheld despite addition of ZnO in a variety of combination ratios with Ag.

Figure 3:
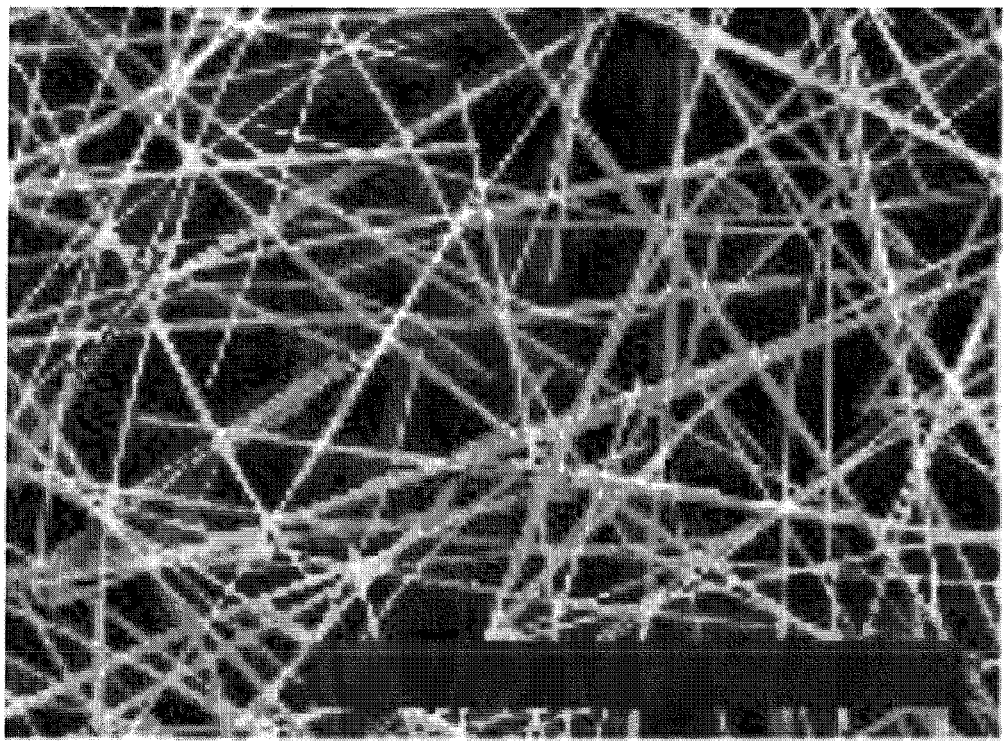
FIG. 3 shows a densely sprayed Ag nanowire mesh (scale bar=2 μm), as may be consistent with one or more embodiments.
Figure 4:
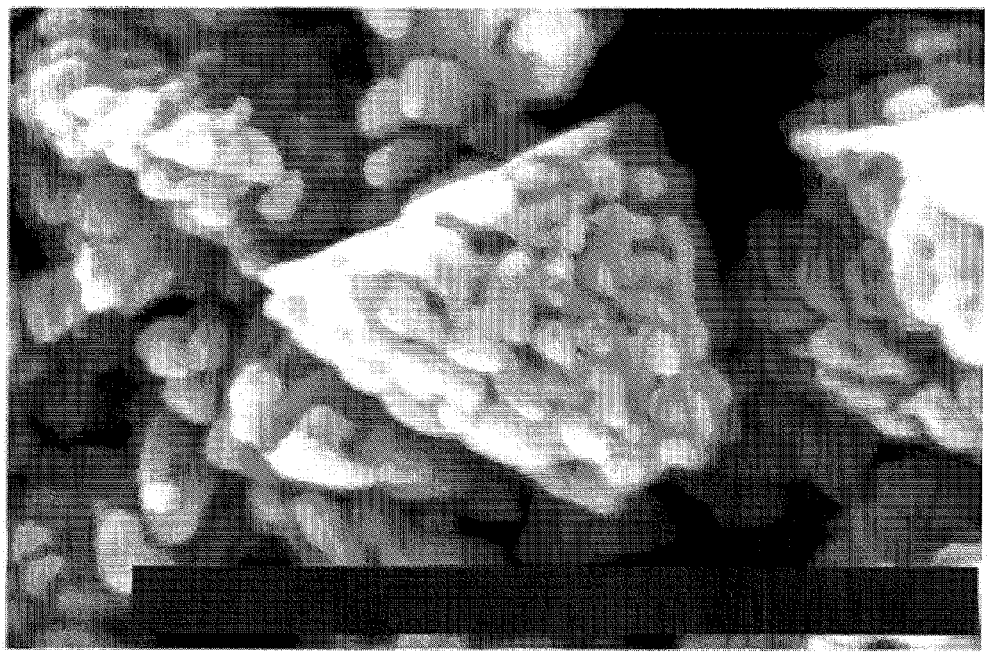
FIG. 4 shows a sprayed ZnO nanoparticles (scale bar=500 nm), as may be consistent with one or more embodiments.

The deposition and post-processing methods described above can be used to yield flat, electrically connected and uniform Ag nanowire layers (in the form of meshes) and ZnO nanoparticles. FIG. 3 shows a dense mesh of Ag nanowires as sprayed onto glass with no post-processing. Despite this high density, wire distribution is uniform and clumping and bundling of wires is minimal. FIG. 4 shows sprayed ZnO nanoparticles. In this embodiment, the nanoparticles have been engineered to facilitate (e.g., maximize) visible light scattering and transmission.

Figure 5:
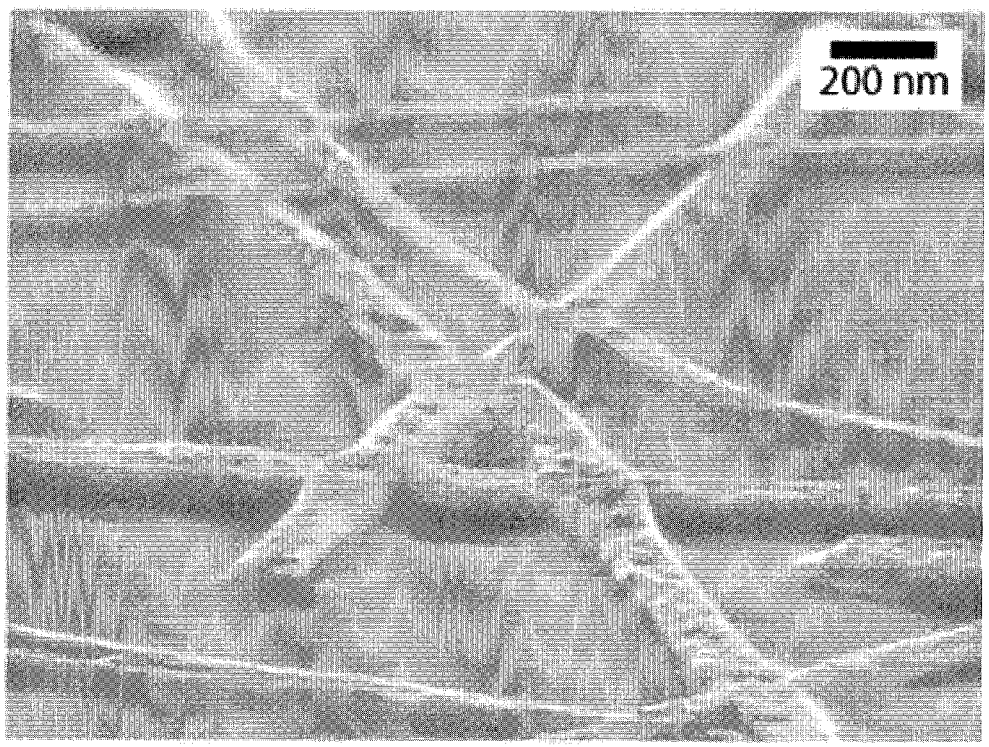
FIG. 5 shows wire-wire junctions, laser annealed and embedded into polymer, as may be consistent with one or more embodiments.

FIG. 5 shows a fully processed spray-deposited Ag nanowire mesh embedded into a transparent polymer. This image highlights aspects of various embodiments as achieved via post processing techniques described here. First, the wire-wire junctions are well connected. This high degree of connectivity reduces sheet resistance without impacting light transmission. Second, the wires and junctions are flat. This reduces shunting and allows for high performance OPV and OLED devices to be made.

Various embodiments are directed to laser annealing, to facilitate control over the amount of energy added to the mesh and produce superior results after annealing. Annealing times are measured in seconds rather than hours, allowing this process to be compatible with high throughput roll-to-roll production lines.

Table 1 (below) exemplifies laser annealing of a ZnO:Ag nanoparticle film and annealing of an Ag nanowire (AgNW) film annealed in an oven. As indicated, there are varying effects of different annealing techniques on the sheet resistances of nanostructured films.

TABLE 1

| SUBSTRATE | ANNEALING METHOD | $R_{SHEET}$ (sprayed) | $R_{SHEET}$ (post-annealed) |
|---|---|---|---|
| 2:1 ZnO: Ag-1 mg/in² | $CO_2$ Laser | 855.08 | 23.15 |
| AgNWs- 0.33 mg/in² | Oven annealing | 389.75 | 28.14 |
| AgNWs- 0.66 mg/in² | Oven annealing | 22.22 | 9.69 |

Conductive AgNW meshes can be disconnected by overheating them using the same laser annealing technique described above at higher laser powers. The increased laser power causes the wires to coalesce into spheres, leaving a non-conductive region. This high resolution process allows for selective patterning of 30 μm non-conductive regions.

Figure 6:
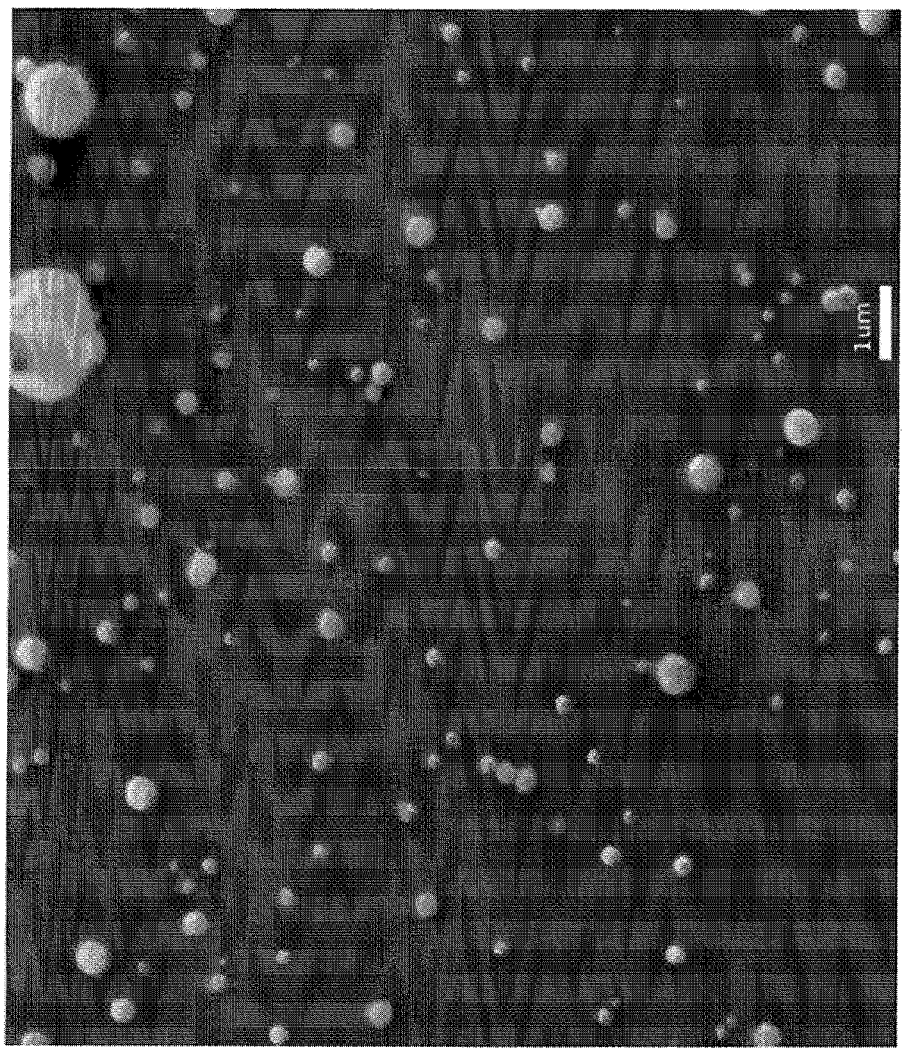
FIG. 6 shows a disconnected wire mesh after laser patterning, as may be consistent with one or more embodiments.
Figure 7:
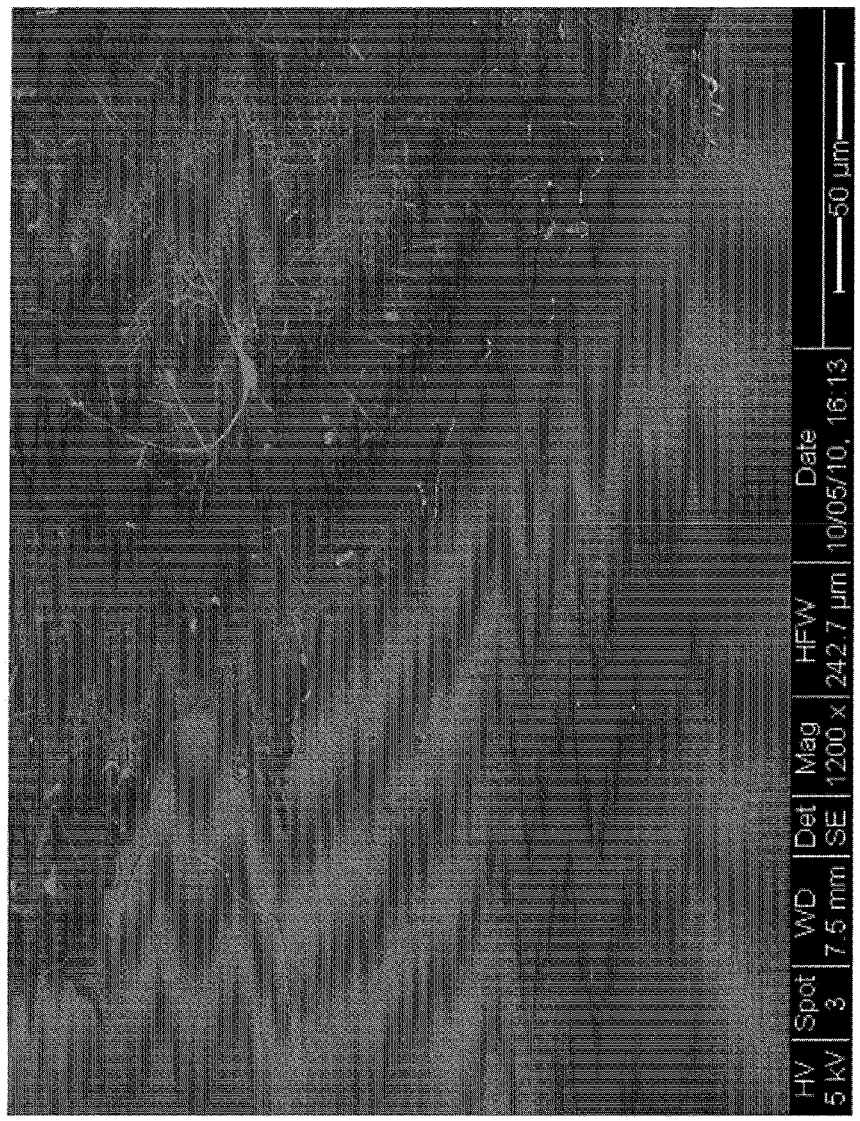
FIG. 7 shows a laser pattern edge of Ag nanowires on glass substrate, as may be consistent with one or more embodiments.

FIG. 6 shows an Ag nanowire mesh on glass that has been transformed into disconnected spheres of silver after application of a 30 W $CO_2$ laser. FIG. 7 shows laser ablation used with a flattened Ag nanowire mesh embedded in a polymer. The left hand side of FIG. 7 shows clean glass substrate after PMMA and flattened Ag nanowires that have been laser ablated. The right hand side shows a conductive Ag nanowire mesh embedded in PMMA that is largely unaffected by the laser ablation patterning technique.

In certain embodiments, it can be important to produce a thin film that has a high conductivity while allowing desirable light transmission. Since many applications concern visible light, percent transmission is defined here as total transmission weighted by the sun's AM1.5 spectrum. Transmission can be measured with an integrating sphere to capture photons scattered by the film in addition to specular photons. Sheet resistance can be measured with a four point probe.

The DC to optical conductivity ratio is a single metric that combines both transmission and conductivity of a transparent film. The conductivity ratio is given by the following equation:

$$T = \left(1 + \left(\frac{188.5}{R_s}\right) \cdot \left(\frac{\sigma_{OP}}{\sigma_{DC}}\right)\right)^{-2}$$

A higher DC to optical conductivity ratio is usually more desirable.

Figure 8:
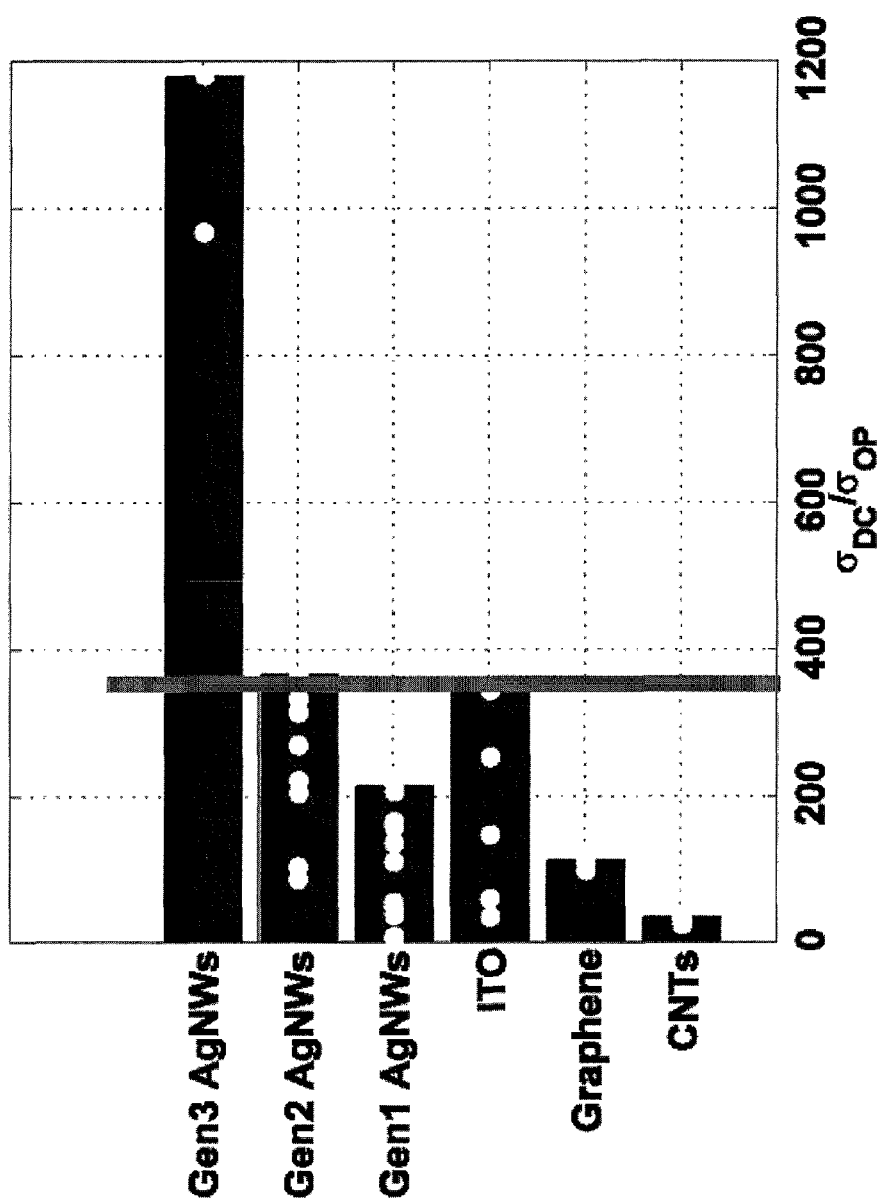
FIG. 8 shows a DC to optical conductivity ratio comparison for several transparent conductor implementations, as may be consistent with one or more embodiments.
Figure 9:
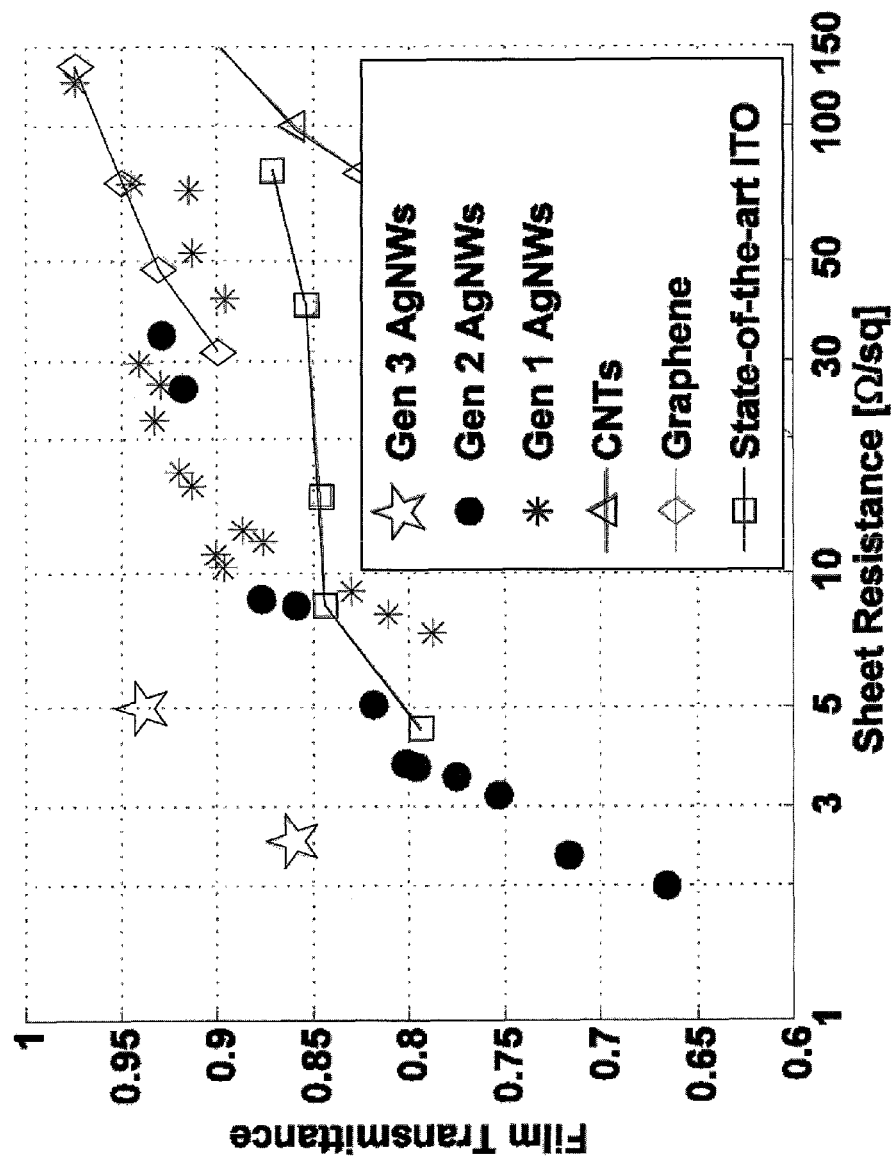
FIG. 9 shows a transmittance & sheet resistance comparison for several transparent conductor implementations, as may be consistent with one or more embodiments.

FIG. 8 and FIG. 9 demonstrate three generations of Ag nanowire meshes presented herein and other transparent conductor technologies (ITO, Graphene, and CNTs). First generation Ag nanowires (Gen1 AgNWs) results are from drop casted wire meshes. Second generation Ag nanowires (Gen2 AgNWs) results show initial spray coater results with oven annealing. Third generation Ag nanowires (Gen3 AgNWs) results were achieved using control of spray deposition parameters and laser annealing post processing.

The scattering efficiency of films is measured using the haze factor. Thus:

$$\text{Haze}(\lambda) = T_{diffuse}(\lambda)/T_{total}(\lambda),$$

where $T_{total}(\lambda)$ is the diffuse transmission at a given wavelength, and $T_{dtotal}(\lambda)$ is the total transmission at a given wavelength. The haze factor can be interpreted as the fraction of transmitted light, which is scattered at a degree greater than 2.5 degrees from the incident light cone. For thin-film photovoltaic applications, where maximizing light absorption can be critical to improved device efficiencies, high haze factors can be employed in transparent electrodes to increase the path length of sub-band gap photons in photovoltaic device active layers.

Figure 10:
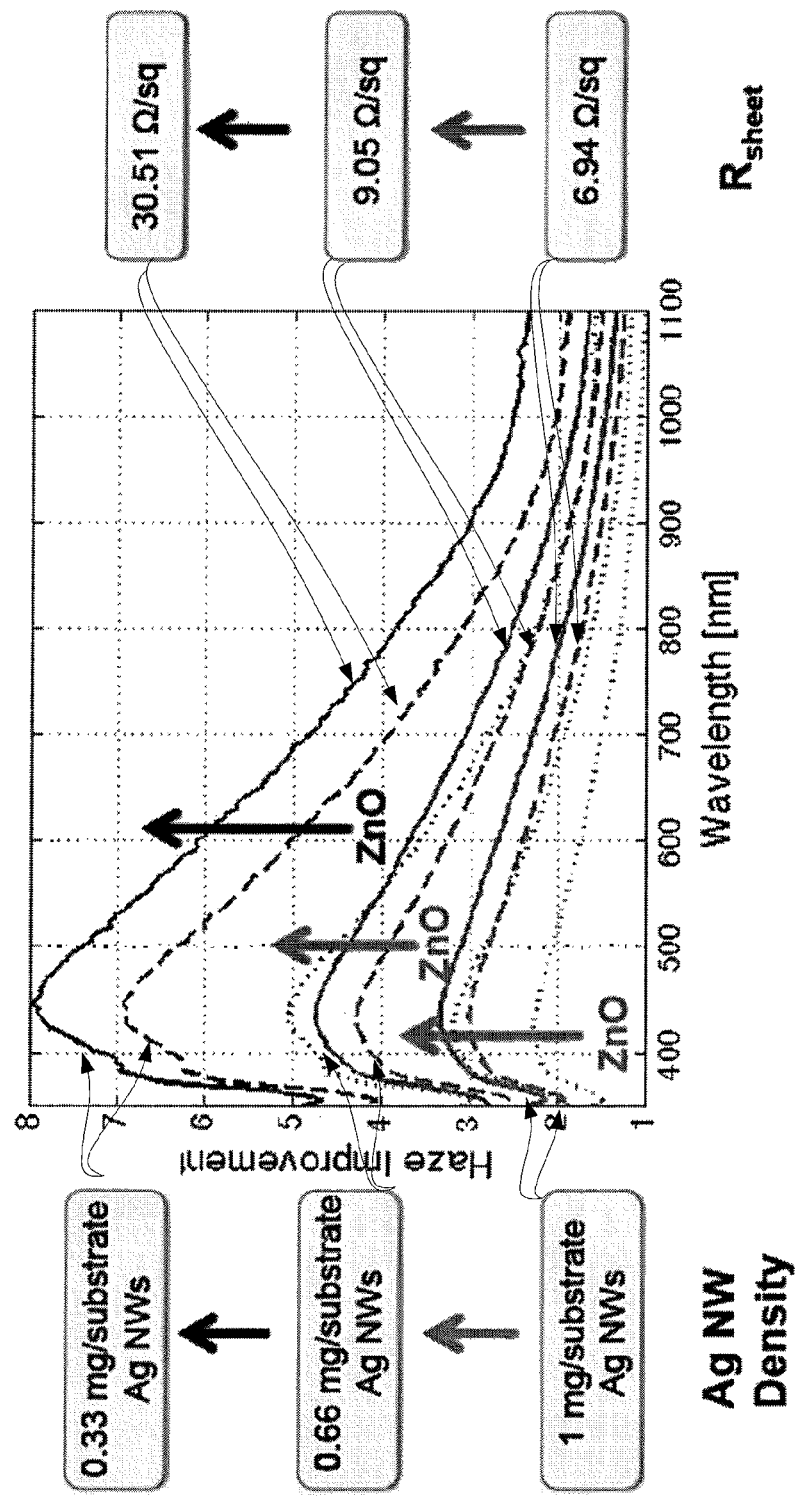
FIG. 10 shows haze improvement of hybrid films relative to pure Ag, as may be consistent with one or more embodiments.

FIG. 10 shows scattering that can be achieved by spraying increasing amounts of ZnO nanopyramids onto identical substrates with equal densities of Ag nanowires (note that the haze from hybrid Ag:ZnO films are normalized by the haze of a pure Ag nanowire film sprayed at the same conditions). With increasing amounts of ZnO, increases in the sheet resistances are observed but consistently remain below 100 Ω/sq. Similarly, FIG. 11 shows the haze from the same films as shown before, but instead normalized to the haze observed in CVD deposited ZnO films to compare the haze with a standard.

Figure 11:
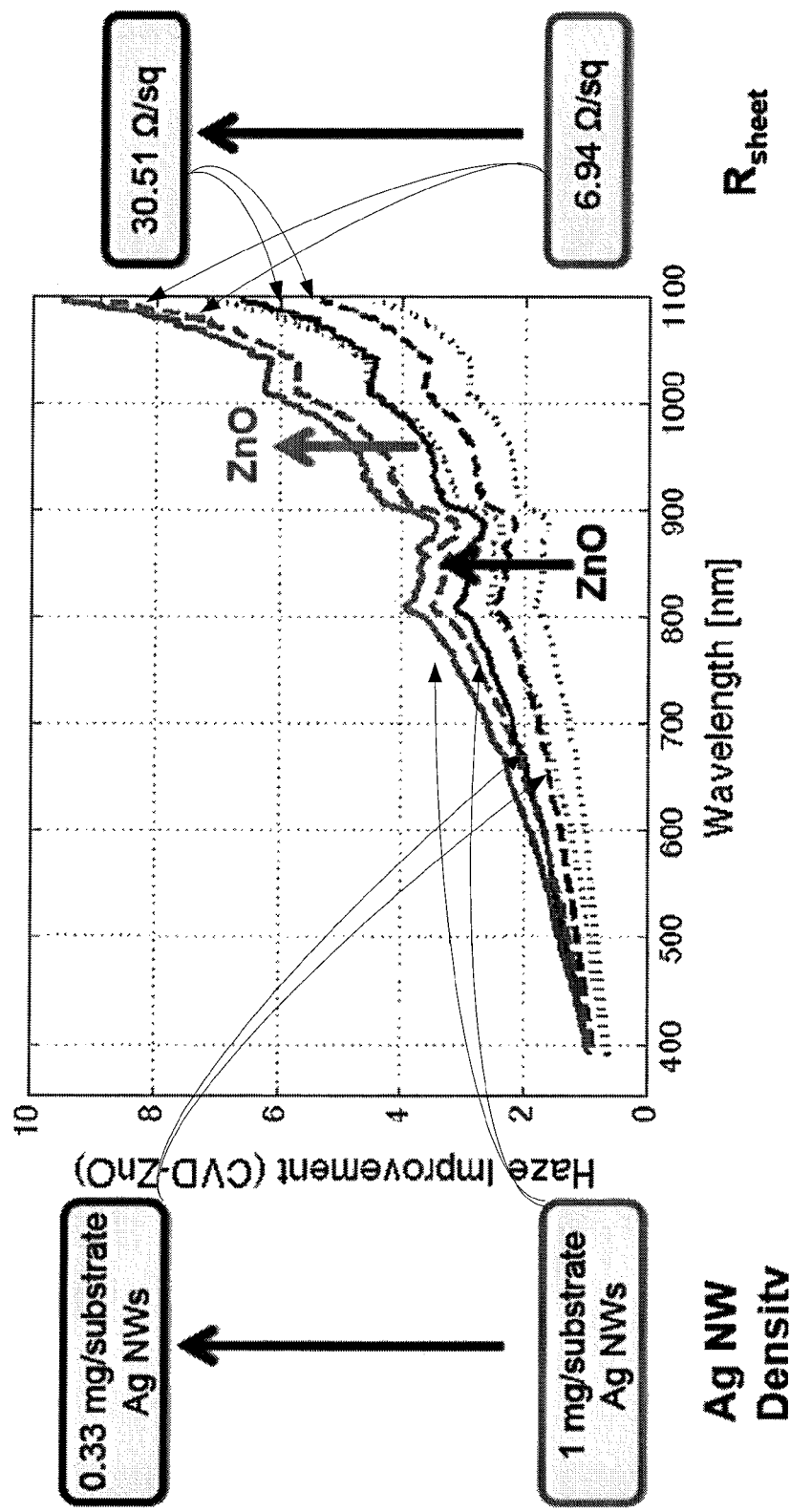
FIG. 11 shows hybrid film haze improvement, as may be consistent with one or more embodiments.

FIG. 11 shows haze improvement of hybrid films relative to low pressure CVD deposited ZnO. Haze improvement refers to the haze of a hybrid nanostructured Ag/ZnO film normalized by the haze of a state-of-the-art vapor deposited ZnO transparent electrode. Here, the haze of the hybrid film is normalized by the haze of a standard ZnO TCO film to illustrate scattering achieved with a hybrid film in accordance with embodiments herein.

Sheet resistances of the sprayed substrates from a particular run were measured at 10 different points per square inch of sprayed material, each of the sprayed substrates had an area of about 1 in². The data shown is from RUN21 in the runlog maintained for all spray deposition runs, where the material sprayed is 10.4 μm mean length and 50 nm mean diameter Ag nanowires.

Table 2 below shows large-area uniformity of spray deposition as confirmed from sheet resistance measurements. Four-probe resistance measurements were performed 10 times on each square inch substrate (1-6) from a given run of spraying pure Ag nanowires with 10.4 μm mean length.

TABLE 2

Large area uniformity data

| $R_{sheet}$ [Ω/sq] | Sub. 1 | Sub. 2 | Sub. 3 | Sub. 4 | Sub. 5 | Sub. 6 |
|---|---|---|---|---|---|---|
| Measurement 1: | 4.98 | 7.16 | 5.72 | 6.44 | 5.08 | 6.51 |
| Measurement 2: | 5.21 | 6.36 | 5.71 | 7.81 | 5.20 | 6.22 |
| Measurement 3: | 5.72 | 6.52 | 5.18 | 8.90 | 5.66 | 7.34 |
| Measurement 4: | 5.94 | 6.96 | 6.43 | 5.74 | 5.48 | 6.63 |
| Measurement 5: | 5.73 | 6.69 | 6.50 | 7.02 | 5.83 | 6.38 |
| Measurement 6: | 6.09 | 6.06 | 5.92 | 6.14 | 5.23 | 6.50 |
| Measurement 7: | 5.80 | 6.28 | 5.68 | 6.40 | 5.79 | 5.79 |
| Measurement 8: | 5.62 | 6.74 | 5.20 | 7.80 | 6.02 | 5.84 |
| Measurement 9: | 6.41 | 6.39 | 5.49 | 6.95 | 5.57 | 6.89 |
| Measurement 10: | 5.58 | 6.34 | 5.28 | 6.25 | 4.95 | 4.40 |
| Average: | 5.71 | 6.55 | 5.71 | 6.94 | 5.51 | 6.25 |
| STD: | 0.41 | 0.34 | 0.47 | 0.97 | 0.33 | 0.79 |

It is clear from the tables that for 6 in$^2$ of sprayed area, variations in the sheet resistances are observed to vary no more than about 17%. This number is comparable to amorphous silicon solar cell manufacturer Oerlikon's low pressure-CVD deposited ZnO transparent electrodes, which exhibit sheet resistance variations of 15%. This illustrates the potential compatibility of this technique as a large-scale deposition mechanism for nanostructured transparent electrodes.

Figure 12:
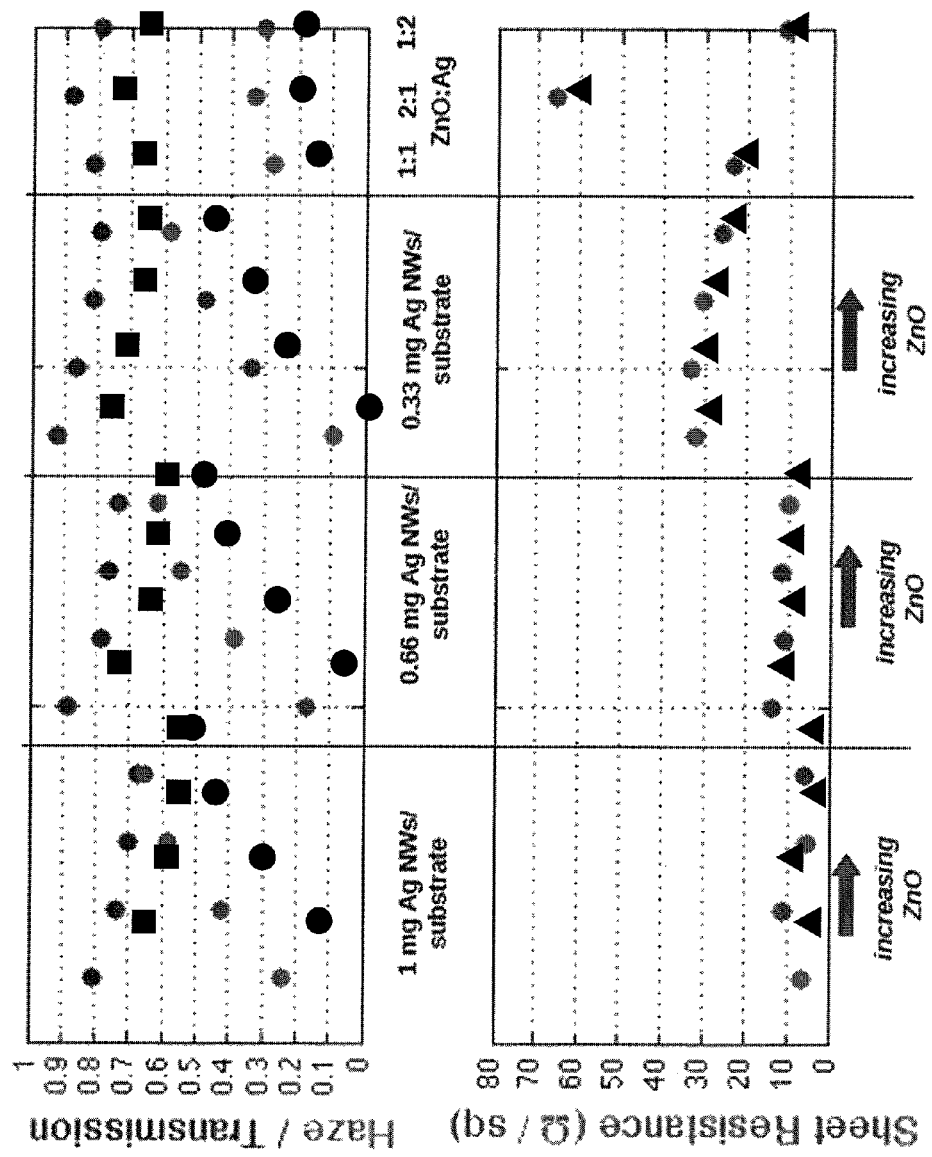
FIG. 12 shows a hybrid film summary, as may be consistent with one or more embodiments.

FIG. 12 summarizes the results and shows the spray deposition runs. The summarized results are obtained from using hybrid nanostructured films with 10.4 μm mean length wires and zinc oxide nanopyramids. The range of electrical, optical, and scattering properties obtained exhibit the versatility of this nanostructured approach to achieve the desired properties for a particular transparent conducting application. The illustration shows the spray deposition runs performed using 10.4 μm Ag nanowires and ZnO nanopyramids 250 nm in height and width. The transmission at 600 nm is shown by the square markers, the haze at 600 nm is shown by the circle markers, and the sheet resistance is shown by the triangle markers. This figure illustrates the range of properties that can be obtained with hybrid films and the ease to which the properties can be tuned, depending on the desired transmission, haze, and sheet resistance. The trade-off between transmission and sheet resistance is small, and low sheet resistances are obtained for transmissions (at 600 nm) greater than 80%.

For a particular Ag density, the transmission is observed to decrease slightly with increasing ZnO density in the visible spectrum, but the haze is observed to increase with the amount of zinc oxide. The sheet resistance, however, does not vary significantly with the amount of zinc oxide in "layered" films, but does decrease with increasing densities of Ag nanowires resulting from the increased connectivity of the nanowire mat. Films are obtained with properties comparable with or better than performance benchmark transparent electrodes.

In accordance with various embodiments, a high degree of flexibility is achieved. Ag nanowire films on flexible 5 mil thick PET can be repeatedly bent to a 1.4 mm radius with no measurable increase in sheet resistance.

The present disclosure is beneficial in producing Organic Photovoltaic (OPV) cells, Organic Light Emitting Diodes (OLEDs), and Capacitive Touch Screens (using Ag nanowire meshes). For such devices, positive results for device performance are shown from producing films with favorable sheet resistance, transmissivity and roughness.

In different aspects, the present disclosure involves a spray-deposition fabrication and post-processing techniques for nanostructured electrodes as may be implemented in a variety of applications. With pure silver nanowire meshes, sheet resistances well below 10 ohms/square and 90% transmission can be achieved. Further, hybrid Ag/ZnO nanostructured films can be used as highly scattering transparent conducting electrodes for use in thin film photovoltaics. Devices such as OLED and OPV on nanowire mesh transparent electrodes can be formed. Such spray-deposited nanostructured transparent electrodes can be used in various capacities and are scalable for roll-to-roll electronics manufacturing.

Table 3 below is a summary of example process variables controlled using a spray deposition process. Process variables and control ranges for each of the parameters depicted therein can be altered to suit particular types of nanostructured film deposition.

TABLE 3

| Process Variable | Range |
|---|---|
| Nozzle Pressure | 0-29 PSI |
| Substrate Temp. | 22.5-150° C. |
| Raster Velocity | 0-300 mm/s |
| Nozzle Height | 0.5-20 cm |
| Suspension Infusion Rate | 1 μL/min-5 μL/min |
| Step Size | 1-100 mm |
| Suspension Concentration | Manual: 0.1-10 mg/mL |

Table 4 below lists particle densities for co-sprayed hybrid ZnO/Ag films in different ratios, and the corresponding sheet resistances. It is understood from this table that the sheet resistance correlates directly to the density of silver nanowires on the substrate.

TABLE 4

| Sample | ZnO Density [particles/cm$^{-2}$] | Ag Density [particles/cm$^{-2}$] | $R_{sheet}$ [Ω sq] |
|---|---|---|---|
| 2:1 ZnO: Ag | 9.91e8 | 7.91e7 | 65.95 |
| 1:1 ZnO: Ag | 6.631e8 | 9.22e7 | 23.15 |
| 1:2 ZnO: Ag | 1.44e8 | 4.359e8 | 10.90 |

The embodiments may be applicable to a variety of applications and structures utilizing transparent and/or conductive films. Various embodiments described above, may be implemented together and/or in other manners. One or more of the items depicted in the present disclosure can also be implemented in a more separated or integrated manner, or removed and/or rendered as inoperable in certain cases, as is useful in accordance with particular applications. In view of the description herein, those skilled in the art will recognize that many changes may be made thereto without departing from the spirit and scope of the embodiments.

What is claimed is:
1. A method, comprising:
providing a first solution having conductive nanowires suspended therein and a second solution having nanostructures suspended therein;
spraying the first and second solutions toward a substrate, and forming at least one mist therefrom, wherein the spraying is configured and arranged with droplets of the mist being sized so that the droplets do not evaporate prior to contacting the substrate;
processing the at least one mist, while on the substrate, to provide a semitransparent conductive material in the form of a mesh having the conductive nanowires and nanoparticles, the nanoparticles configured and arranged to direct light passing and connections between the nanowires configured and arranged to provide a conductivity characteristic throughout the material; and providing the mesh as at least part of a film or layer, and wherein the mist formed from the solution includes droplets that upon reaching the substrate, do not coalesce on a surface of the substrate to form aggregations of nanowires or nanoparticles that cause non-uniformities in the film or layer.

2. The method of claim 1, wherein the first and second solutions are uniformly mixed together prior to contacting the substrate.

3. The method of claim 1, wherein the first and second solutions are sprayed sequentially.

4. The method of claim 1, wherein the conductive nanowires are silver (Ag).

5. The method of claim 1, wherein the nanoparticles are zinc oxide (ZnO).

6. The method of claim 1, wherein the spraying is conducted in a deposition chamber that is purged with nitrogen gas during deposition to ensure laminar flow within the deposition chamber.

7. The method of claim 1, wherein the spraying is configured and arranged with droplets of the mist being sized so that neither nanowires nor nanoparticles coalesce on the substrate, and the droplets do not evaporate prior to contacting the substrate.

8. The method of claim 1, wherein the spraying is configured and arranged with droplets of the mist being sized so that a majority of the droplets includes only one of the nanowires and nanoparticles.

9. The method of claim 1, wherein the spraying is configured and arranged with droplets of the mist being sized so that the droplets do not evaporate prior to contacting the substrate.

10. A method, comprising:
providing a solution having conductive nanowires or nanoparticles suspended therein;
spraying the solution toward a substrate, and forming a mist therefrom with droplets of the mist being sized so that a majority of the droplets includes only one of the nanowires and nanoparticles;
processing the mist, as at least some of the nanowires or nanoparticles are being directed toward or on the substrate, to provide a semitransparent conductive material in the form of a mesh of the nanowires;
joining the nanowires or nanoparticles of the mesh at points where the nanowires or nanoparticles cross or touch to provide a conductivity characteristic throughout the semitransparent conductive material;
providing the mesh as at least part of a film or layer; and
after the step of joining, applying laser light in a portion of the mesh to break conductivity of nanowires or nanoparticles in the portion.

11. The method of claim 10, wherein the joining is performed using laser annealing to sinter nanowires at crossing points.

12. The method of claim 11, wherein a cylindrical lens is used to focus the laser into a line shape for the laser annealing.

13. A method, comprising:
providing a solution having conductive nanowires or nanoparticles suspended therein;
spraying the solution toward a substrate, and forming a mist therefrom;
processing the mist, while at least some of the nanowires or nanoparticles are being directed toward and then on the substrate, to provide a semitransparent conductive material in the form of a mesh of the nanowires;
joining the nanowires or nanoparticles of the mesh at points where the nanowires or nanoparticles cross or touch to provide a conductivity characteristic throughout the semitransparent conductive material; and
providing the mesh as at least part of a film or layer, and
after the step of joining, applying laser light in a portion of the mesh to break conductivity of nanowires or nanoparticles in the portion, wherein the application of laser light transforms the nanowires or nanoparticles in the portion of the mesh into spheres.

14. The method of claim 10, wherein the mist includes droplets and wherein the step of processing the mist includes processing said at least some of the nanowires or nanoparticles before they reach the substrate and after they are on the substrate, by regulating sizes of the droplets.

15. The method of claim 10, wherein the mist includes droplets and wherein the step of processing the mist includes processing nanoparticles previously contained in the mist while the nanoparticles are on the substrate by regulating sizes of the droplets, and wherein the method further includes using laser annealing to sinter nanowires at crossing points.

16. The method of claim 10, wherein the step of providing the mesh includes a process that includes a laser ablation technique.

17. The method of claim 16, wherein the step of providing the mesh includes yielding a flat, electrically connected and uniform layer, and wherein the substrate is a supporting structure characterized or composed of glass.

18. The method of claim 10, wherein the mist includes droplets that upon reaching the substrate, do not coalesce on a surface of the substrate to form aggregations of nanowires or nanoparticles.

19. The method of claim 10, wherein the mist includes droplets that are sufficiently large to reach the substrate before evaporating but not so large that they coalesce on a surface of the substrate and therefrom form aggregations of nanowires or nanoparticles that cause non-uniformities in the film or layer.

20. The method of claim 10, wherein the mist includes droplets that are sufficiently large to reach the substrate before evaporating but not so large that they coalesce on a surface of the substrate and therefrom form aggregations of nanowires or nanoparticles that cause non-uniformities in the film or layer, and further including the steps of using a nozzle to spray the mist and controlling the mist as a function of at least two of the following parameters: nozzle pressure, infusion rate, and nozzle height.

21. The method of claim 10, further including the steps of using a nozzle to spray the mist and controlling the mist as a function of at least two of the following parameters: nozzle pressure, infusion rate, and nozzle height.

22. The method of claim 10, further including the steps of using a nozzle to spray the mist and controlling the mist as a function of at least two of the following parameters: nozzle pressure being less than 29 PSI, suspension infusion rate is less than 5 mL/min, and nozzle height within a range of 0.5-20 cm.

23. The method of claim 10, wherein the substrate is a structure arranged for supporting the mesh, and further including providing the mesh on a synthesized material.

24. The method of claim 1, wherein the mist formed from the solution includes droplets that are sufficiently large to reach the substrate before evaporating but not so large that they coalesce on a surface of the substrate and therefrom form aggregations of nanowires or nanoparticles that cause non-uniformities in the film or layer.

25. A method, comprising:
- providing a first solution having conductive nanowires suspended therein and a second solution having nanostructures suspended therein;
- spraying the first and second solutions toward a substrate, and forming at least one mist therefrom, wherein the spraying is configured and arranged with droplets of the mist being sized so that the droplets do not evaporate prior to contacting the substrate;
- processing the at least one mist, while on the substrate, to provide a semitransparent conductive material in the form of a mesh having the conductive nanowires and nanoparticles, the nanoparticles configured and arranged to direct light passing and connections between the nanowires configured and arranged to provide a conductivity characteristic throughout the material; and
- using a nozzle to spray the mist and controlling the mist as a function of at least two of the following parameters: nozzle pressure, infusion rate, and nozzle height.

* * * * *